(12) United States Patent
Larson

(10) Patent No.: US 10,091,906 B2
(45) Date of Patent: Oct. 2, 2018

(54) OFF-CENTER COMPONENT RACKING

(71) Applicant: Intel Corporation, Santa Clara, CA (US)

(72) Inventor: Thane M. Larson, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/047,454

(22) Filed: Feb. 18, 2016

(65) Prior Publication Data
US 2017/0245390 A1 Aug. 24, 2017

(51) Int. Cl.
H05K 7/14 (2006.01)
H05K 7/18 (2006.01)
H05K 5/00 (2006.01)
H04Q 1/02 (2006.01)

(52) U.S. Cl.
CPC .......... *H05K 7/1492* (2013.01); *H05K 7/183* (2013.01); *H04Q 1/13* (2013.01); *H05K 5/0021* (2013.01); *H05K 7/1425* (2013.01); *H05K 7/1488* (2013.01); *H05K 7/1498* (2013.01); *H05K 7/18* (2013.01)

(58) Field of Classification Search
CPC .. H05K 7/1492; H05K 5/0021; H05K 7/1488; H05K 7/1498; H05K 7/18; H05K 7/1425; H05K 7/183; H04Q 1/13
USPC .................................. 361/724, 728
See application file for complete search history.

(56) References Cited

U.S. PATENT DOCUMENTS

| 7,781,675 | B2 * | 8/2010 | Adducci | E05C 9/043 |
| | | | | 174/50 |
| 8,467,175 | B2 * | 6/2013 | Schmitt | H05K 7/1488 |
| | | | | 361/679.02 |
| 8,848,722 | B2 * | 9/2014 | Chapel | H01R 25/006 |
| | | | | 370/220 |
| 2007/0165618 | A1 * | 7/2007 | Niazi | H04L 49/40 |
| | | | | 370/360 |
| 2013/0188309 | A1 * | 7/2013 | Ross | H05K 7/20727 |
| | | | | 361/679.48 |

* cited by examiner

Primary Examiner — James Wu
(74) Attorney, Agent, or Firm — Schwabe, Williamson & Wyatt, P.C.

(57) ABSTRACT

Apparatuses and systems associated with a server rack to hold a plurality of rack components may include a cabinet having a front opening of width W, and a first mounting pole and a second mounting pole located parallel to each other at the front opening to facilitate receipt and to hold the plurality of rack components. The server rack may further include the first and second mounting poles having a spacing of x inches or centimeters from each other, with the mid-point of the spacing being offset from the mid-point of width W, that defines a first mounting space to receive a first subset of the rack components in a first orientation and a second mounting space to receive a second subset of the rack components in a second orientation that differs from the first orientation. Other embodiments may be described and/or claimed.

5 Claims, 4 Drawing Sheets

OFF-CENTER COMPONENT RACKING

FIELD

Embodiments of the present disclosure generally relate to the field of computing systems. More specifically, embodiments of the present disclosure relate to racking components in different orientations within a computing equipment cabinet in a data center.

BACKGROUND

Generally, data center racks hold servers, switches, and other computing equipment components in a 24-inch wide computing equipment cabinet (hereinafter, simply "cabinet") having a component rack 19 inches from mounting hole to mounting hole in width and centered within the cabinet. Computing equipment components (hereinafter, may also be referred as rack components) are then inserted into the component rack from the front towards the back, and are stacked vertically top to bottom. The space within the cabinet between the component rack and the side of the cabinet is typically unused. In a typical data center configuration, multiple data center component racks are positioned back to back, with an alleyway between them to allow for cabling and cable access running between the various components in the component rack and between other component racks. This configuration may result in an excess of cabling that will be more expensive and may impede cooling airflow.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
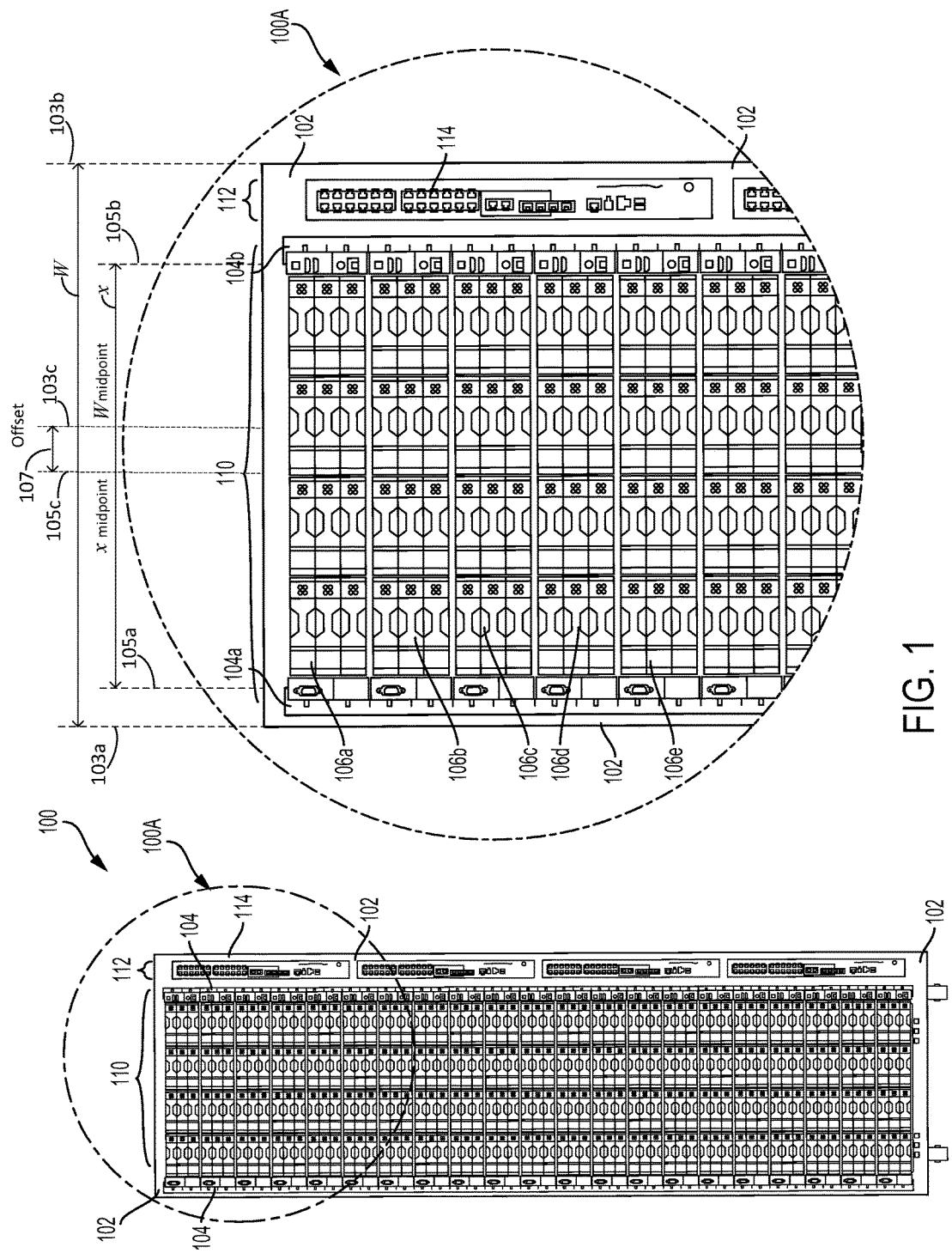
FIG. 1 illustrates a front view of an offset rack that includes a cabinet with an offset rack chassis, in accordance with some embodiments.

Methods, apparatuses, and systems associated with positioning a rack chassis in an offset position within a cabinet are disclosed herein. In embodiments, an offset rack may include a cabinet having a front opening of width W, and a first mounting pole and a second mounting pole located parallel to each other at the front opening of the cabinet to facilitate receipt of a plurality of rack components. The offset rack may further include the first and second mounting poles having a spacing of x inches or centimeters from each other, with the mid-point of the spacing being offset from the mid-point of width W, that defines a first mounting space to receive a first subset of the rack components in a first orientation and a second mounting space to receive a second subset of the rack components in a second orientation that differs from the first orientation. Details of these and/or other embodiments, as well as some advantages and benefits, are disclosed and described herein.

In the following description, various aspects of the illustrative implementations are described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "including," "having," and the like, as used with respect to embodiments of the present disclosure, are synonymous.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

Various embodiments of the offset rack, placement of one or more rack components in the offset rack based at least upon the offset rack chassis, wiring configurations between the rack components, and hot docking capabilities of rack components within the offset rack chassis may allow for a higher density of rack components within an offset rack, decrease the expense and inefficiency of cabling the rack components, and increase the cooling efficiency among the components.

FIG. 1 illustrates a front view of an offset rack that includes a cabinet with an offset rack chassis, in accordance with some embodiments. Diagram 100 shows a cabinet 102 surrounding an offset rack chassis 104. The offset rack chassis 104 may include a first pole 104a and a second pole 104b, to which rack components may be attached. In embodiments, the center of a first mounting space 110 of the offset rack chassis 104 may be offset from the center of the rackmount cabinet body 102.

In embodiments, the offset rack chassis 104 may have a first mounting space 110 into which rack components, such as a plurality of server rack components 106a-106d, may be inserted and/or attached in a first orientation. In non-limiting examples, this first orientation may be considered a horizontal orientation as shown, and one or more rack components may have the same or varied U heights. A U height may indicate one rack unit of height, which may equal 1.75 inches of rack height.

In embodiments, the offset rack chassis 104 may have a second mounting space 112 into which rack components, such as a network switch rack component 114 may be inserted and/or attached in a second orientation. In non-limiting examples, this second orientation may be considered a vertical orientation as shown, orthogonal to the first orientation. In one non-limiting example, the width of the first mounting space 110 may be 19 inches, and the width of the cabinet 102 may be 24 inches. By offsetting the offset rack chassis 104 as shown, the second mounting space 112 may have up to 5 inches of space into which a rack component 114 may be inserted. In this non-limiting example, a 1 U or a 2 U device may be mounted in the second mounting space in the second orientation.

FIG. 1 illustrates one non-limiting example of an offset of rack chassis 104 within cabinet 102. Referring to diagram 100A, the width of cabinet 102 may be shown by the dimension W between the sides 103a, 103b of cabinet 102, having a midpoint of W midpoint 103c. The width of offset rack chassis 104 may be shown by the dimension x between the sides 105a, 105b, having a midpoint of x midpoint 105c. The difference between the two midpoints may be represented as the distance of a line 107, which represents an offset value.

In implementation of embodiments where, for example, the component 114 may be a RAID data storage component located near to server rack components 106a-106d, the cables and cabling patterns for connecting these components may be shorter and less complicated than if the RAID data storage component was located in a lower rack slot 106e.

Figure 2:
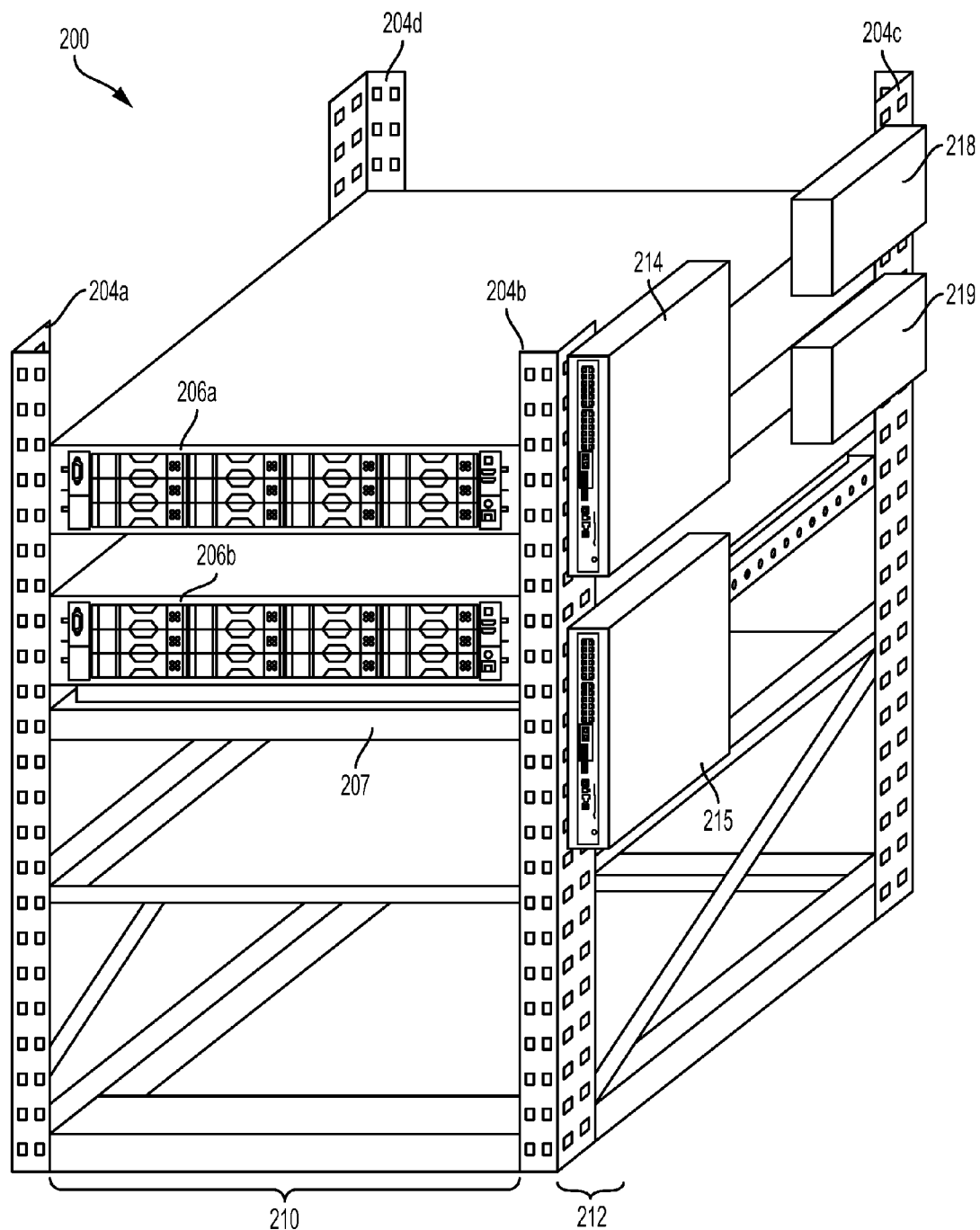
FIG. 2 illustrates a perspective view of an offset rack chassis by itself, in accordance with some embodiments.

FIG. 2 illustrates a perspective view of an offset rack chassis by itself, in accordance with some embodiments. One non-limiting example offset rack chassis 200, shown without a surrounding cabinet, may include a first mounting space 210, which may be similar to the first mounting space 110 of FIG. 1, and the second mounting space 212, which may be similar to the second mounting space 112 of FIG. 1. The first mounting space 210 may be defined by mounting poles 204a, 204b, 204c, 204d. Mounting poles 204a and 204b may be similar to mounting poles 104a and 104b of FIG. 1. In embodiments, the second mounting space 212 may be defined by two mounting poles 204b and 204c. Within the first mounting space 210, rackmount devices 206a, 206b may be attached. In embodiments, this attachment may be directly to the mounting poles 204a, 204b, 204c, 204d, or to a supporting apparatus such as a shelf 207. In some embodiments, the supporting apparatus 207 may be a sliding shelf.

The second mounting space 212, may include space to hold vertically oriented rack components 214, which may be similar to rack component 114 shown in FIG. 1, and rack component 215 at the forward opening of the cabinet. In embodiments, the second mounting space 212 may also be bounded by a third pole (not shown) to the right of mounting pole 204b, which may be used to further secure rack components 214, 215 stored in the second mounting space.

Rack components for placement within the example offset rack chassis 200 may include a variety of components, including but not limited to servers, disks, RAID arrays, network switches, power supplies, routers, bridges, controllers, audio-visional equipment such as CD/DVD players, tape players, tuners, amplifiers, special purpose computers, test and measurement equipment, and the like. In embodiments, there may be a preferred orientation for individual rack components that may determine the placement of the particular component within the example offset rack chassis 200. For example, a CD or DVD rackmount component may have a preferred horizontal orientation.

The additional rack component space and orientation options in one or more embodiments may provide advantages. For example, rack components may be placed in different orientations within the example offset rack chassis 200 to minimize the length of cable required for cabling components within the offset rack chassis. This may also increase the amount of airflow around the rackmount components for cooling. In one non-limiting example, instead of placing network switches at the top of the rackmount chassis 200 and running cabling from the switches to each of the rackmount components below, servers and RAID arrays may be placed at the top of the offset rack chassis in the first mounting space 210, and network switches 214, 215 may be placed in the second mounting space 212. In embodiments, the network switches 214, 215 may be oriented so that the cables may be plugged into the switches from the rear of the example offset rack cabinet 200. This configuration may result in a shorter distance of Ethernet category five cabling needed to connect the rack components. Other advantages may include more volume within the rackmount chassis 200 to include additional input/output cards, memory, or processors.

In addition, rack components may be placed in various locations in relation to the front as compared to the back of the rackmount chassis 204, depending upon the size of the rackmount component. In one non-limiting example, power supplies 218, 219 may be placed at the rear of the rackmount chassis 204. In other embodiments, two or more rackmount components may be placed this way within a first or a second orientation in the example offset rack chassis 200.

Figure 3:
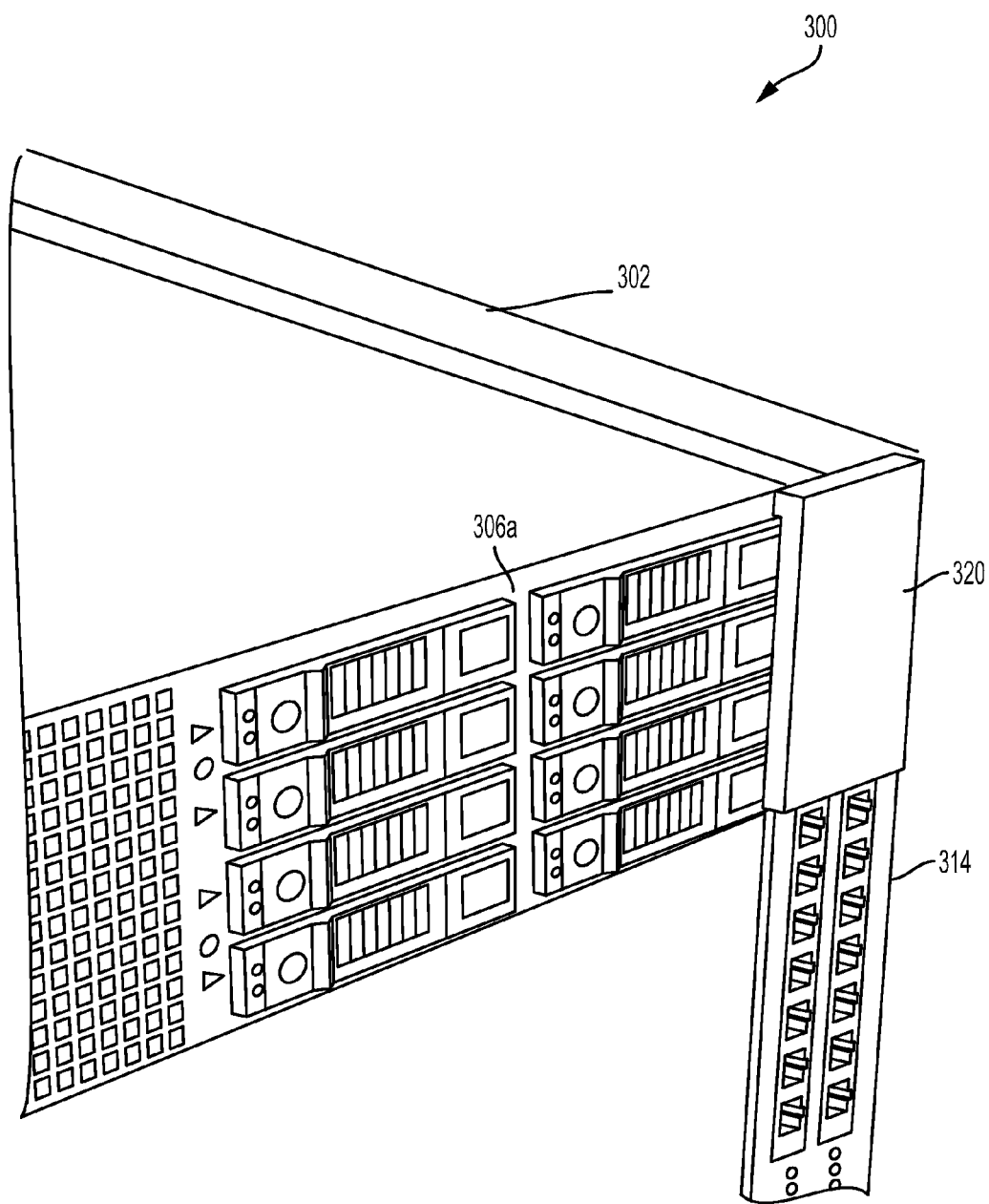
FIG. 3 illustrates a zoom in view of an offset rack with a front bezel adapter, in accordance with some embodiments.

The mounting poles 204a, 204b, 204c, 204d may be designed and/or made of any suitable material to support rack components. In non-limiting examples, the poles may be made of metal, carbon fiber, wood, or other synthetic material. In non-limiting examples, the shape of the poles may be round, square, angle-iron shaped, or any other suitable shape to form and/or to support an offset rack chassis as shown in diagram 200. In embodiments, poles 204a, 204b, 204c, 204d may include holes, clips, fasteners, and/other supporting apparatus to allow rack components to be attached to the offset rack chassis. In embodiments, the supporting apparatus may allow a rack component to be fixed within the offset rack chassis. In embodiments, the supporting apparatus may allow a rack component to slide in and out of an offset rack chassis while the rack component and supporting apparatus remain connected to the offset rack chassis FIG. 3 illustrates a zoom in view of an offset rack with a bezel adapter, in accordance with some embodiments. Diagram 300 shows an embodiment of a bezel adapter 320 disposed at a corner of the off center rack that may be coupled to a rack component 306a in the first mounting space, which may be similar to the rack component 206a of FIG. 2. In embodiments, a bezel adapter 320 may bridge electrical and/or other connections between a first rack component 306a in the first mounting space, and a second rack component 314 in the second mounting space, which may be similar to rack component 214 of FIG. 2, without requiring cables. In embodiments, the bezel adapter 320 may be a part of the rack component 306a. In embodiments, the bezel adapter 320 may be attached to the rack component 306a either before or after the rack component 306a is inserted into the example offset rack chassis in the first mounting space in the first orientation shown in diagram 300.

In embodiments, the bezel adapter 320 may be designed to couple to a second component 314 that may be placed in the second mounting space in the second orientation, thus allowing component 306a and component 314 to be coupled without the use of cables. In the example shown in diagram 300, a rack server 306a is attached to a network switch 314 by a bezel adapter 320, without the use of cable. In embodiments, the bezel adapter may connect respective individual servers included within the rackmount server 306a to respective individual network ports, in the example shown via Ethernet category five connections, and the network switch 314. In other non-limiting embodiments, the first rack component device 306a may be one of any number of types of rack component devices that may have one or more connections to a second rack component device 314. In other embodiments, bezel adapter 320 may allow connections with fabrics such as Intel® Omni-Path™, Infinband™, or universal serial bus (USB).

In embodiments, the bezel adapter 320 may allow the component devices associated with it, for example the rackmount server 306a, to route the network, or fabric, of the server 306a to a connector on the bezel adapter 320 (not shown) that may directly mate with a network switch 314. In embodiments, this may allow the server 306a to be inserted into the example offset rack chassis shown in diagram 300 and may be automatically connected to the network switch 314 next to it, without the need of additional cabling. This way, connections within the offset rack chassis shown in diagram 300 may make server 306a in a rack analogous to a server blade in a modular chassis. In embodiments, this direct connection may be similar to the functionality of a hot swappable bay, in which one and/or both components 306a, 314 may be operating while the component 306a is removed from the offset rack chassis shown in diagram 300 and a new and/or replacement component is inserted in its place.

Figure 4:
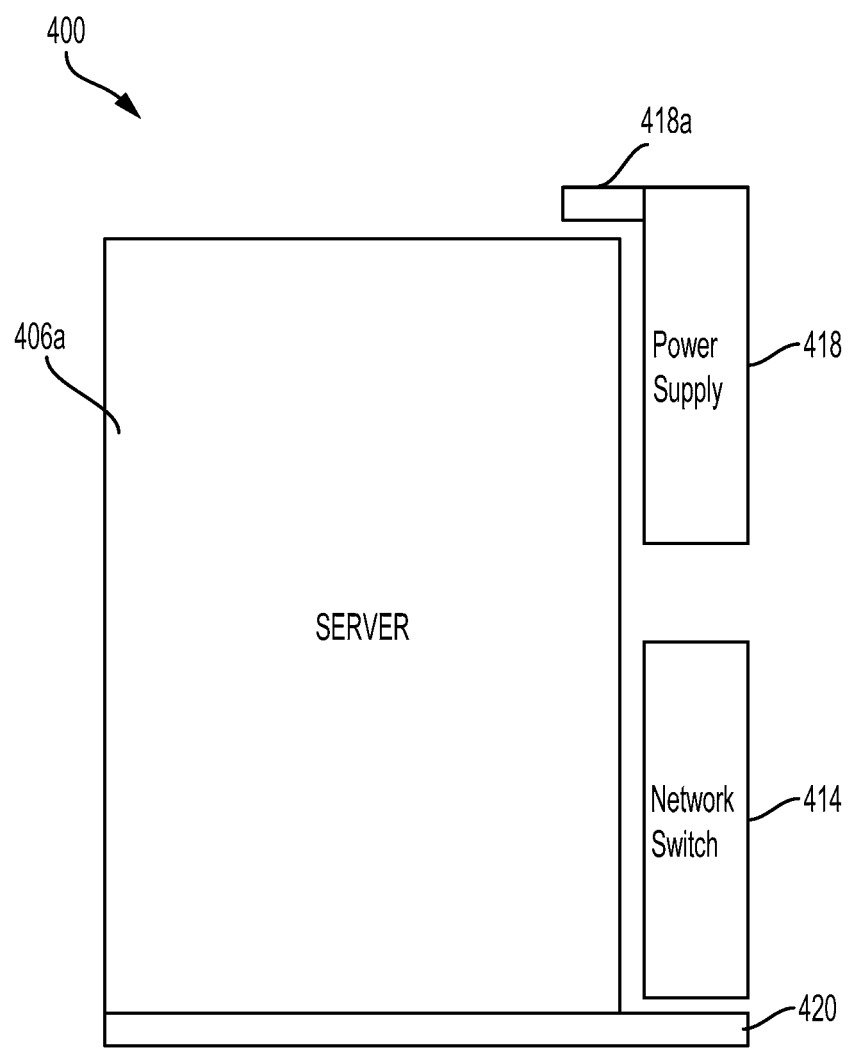
FIG. 4 is a schematic top view of an offset rack chassis, with a server having a front bezel adapter, in accordance with some embodiments.

FIG. 4 is a schematic top view of an offset rack chassis, with a front bezel adapter, in accordance with some embodiments. Diagram 400 shows a a server component 406a, in a top cut away view of an offset rack chassis, which may be similar to server component 306a of FIG. 3, that is mounted in the first orientation in the first mounting space. The server component 306a may be mated with a bezel adapter 420, which may be similar to the bezel adapter 320 of FIG. 3 and may operate as described above. Server component 406a may be plugged into network switch 414 mounted in the second orientation in the second mounting space, which may be similar to network switch 314 of FIG. 3, using bezel adapter 420 (and eliminating the need of cabling). In addition, power supply 418 mounted in the second orientation in the second mounting space, which may be similar to power supply 218 of FIG. 2, may include an ear 418a, or some other suitable coupling mechanism attached to the power supply 418, with which the server component 406a may directly couple with when the server is inserted into the offset rack chassis. Once fully inserted, the power supply 418 may provide power to the server 406a. In embodiments, no additional cabling may be used to connect the network switch 414 and/or the power supply 418. In embodiments, the network switch 414 and the power supply 418 may be replaced by any other rackmount component device.

Various operations are described as multiple discrete operations in turn, in a manner that is most helpful in understanding the claimed subject matter. However, the order of description should not be construed as to imply that these operations are necessarily order dependent.

EXAMPLES

According to various embodiments, the present disclosure describes a number of embodiments related to devices, systems, and methods for a rackmount computing chassis and/or rackmount computing cabinet having a first mounting space to receive a first subset of rack components in a first orientation, and a second mounting space to receive the second subset of rack components in a second orientation that differs from the first orientation. Set forth below are numerous examples and implementations of the embodiments.

Example 1 may be an offset rack, comprising: a cabinet having a front opening of width W; and a first mounting pole and a second mounting pole located parallel to each other at the front opening to facilitate receipt and hold a plurality of rack components; wherein the first and second mounting poles have a spacing of x inches or centimeters from each other, with the mid-point of the spacing being offset from the mid-point of width W.

Example 2 may be the offset rack of claim 1, wherein the first and second mounting poles define a first mounting space to receive a first subset of the rack components in a first orientation and a second mounting space to receive a second subset of the rack components in a second orientation that differs from the first orientation.

Example 3 may be the offset rack of claim 2, wherein the rack components have 1 U, 2 U, 3 U or 4 U format.

Example 4 may be the offset rack of claim 3, wherein the second mounting space has a rack component has a 4 U format.

Example 5 may be offset rack of claim 2, further comprising a first rear mounting pole and a second rear mounting pole located parallel to each other at a rear opening of the cabinet and parallel to the first mounting pole and the second mounting pole at the front opening, wherein the first rear mounting pole and the second rear mounting pole have a spacing of x inches or centimeters from each other, and wherein the distance between the first rear mounting pole and the second mounting pole is substantially equal to the distance between the first mounting pole and the second rear mounting pole.

Example 6 may be the offset rack of any of claim 1 or 2, wherein x equals 19 inches, and/or W equals 24 inches.

Example 7 may be the offset rack of claim 2, wherein one or more servers are inserted in the first mounting space and one or more switches are inserted in the second mounting space to allow for shorter cable connections between the one or more servers and the one or more switches than if the one or more switches were inserted at the top of the first mounting space.

Example 8 may be the offset rack of claim 2, wherein the second mounting pole is to support a second subset of rack components in a second orientation.

Example 9 may be the offset rack of claim 8, wherein a third mounting pole is parallel to the first mounting pole and the second mounting pole at the front opening, the second mounting pole is between the first mounting pole and the third mounting pole, and the third mounting pole is to support, in the second mounting space, the second subset of rack components in the second orientation.

Example 10 may be the offset rack of any one of claim 8 or 9, wherein: the second subset of rack components in the second mounting space has at least one second mounting space hot-swap connector, and the first subset of rack components has at least one hot-swap connector that, when inserted into the first mounting space, connects with the at least one hot-swap connector in the second mounting space.

Example 11 may be the offset rack of claim 10, wherein the first subset of rack components has a front bezel including the at least one first mounting space hot-swap connector that connects with the at least one hot-swap connector in the second mounting space.

Example 12 may be the offset rack of claim 10, wherein the first subset of rack components comprises a server component or a data storage component; and the second subset of rack components comprises a data switch.

The foregoing description of one or more implementations provides illustration and description, but is not intended to be exhaustive or to limit the scope of the embodiments to the precise form disclosed or claimed herein. Modifications and variations are possible in light of the above teachings or may be acquired from practice of various implementations of the various embodiments. Future improvements, enhancements, or changes to particular components, methods, or means described in the various embodiments are contemplated to be within the scope of the claims and embodiments described herein, as would readily be understood by a person having ordinary skill in the art.

What is claimed is:

1. An offset rack, comprising:
   a cabinet having a front opening of width W;
   a first mounting pole and a second mounting pole located parallel to each other at the front opening to facilitate receipt and hold a plurality of rack components;
   wherein the second mounting pole is L-shaped;
   wherein the first and second mounting poles have a spacing of x inches or centimeters from each other, with a mid-point of the spacing being offset from a mid-point of width W;
   wherein the mounting poles are disposed between a first side and a second side of the cabinet, the first side and the second side parallel to each other and perpendicular to the front opening;
   wherein the first and second mounting poles define a first mounting space to receive a first subset of the rack components to be coupled to the first and second mounting poles to support the first subset of the rack components in a first orientation;
   wherein the second mounting pole and the first side define a second mounting space to receive a second subset of the rack components to be coupled to the second mounting pole to support the second subset of the rack components in a second orientation that differs from the first orientation;
   wherein a first side of the second mounting pole is to support the first subset of rack components and a second side of the second mounting pole opposite the first side is to support the second subset of rack components; and
   wherein the rack components have a selected one of: 1U, 2U, 3U, or 4U format.

2. The offset rack of claim 1, wherein the second mounting space is to receive a rack component in a 4U format.

3. The offset rack of claim 1, further comprising a first rear mounting pole and a second rear mounting pole located parallel to each other at a rear opening of the cabinet and parallel to the first mounting pole and the second mounting pole at the front opening, wherein the first rear mounting pole and the second rear mounting pole have a spacing of x inches or centimeters from each other, and wherein a distance between the first rear mounting pole and the second mounting pole is substantially equal to a distance between the first mounting pole and the second rear mounting pole.

4. The offset rack of claim 1, wherein W equals 24 inches.

5. The offset rack of claim 1, wherein one or more servers are inserted in the first mounting space and one or more switches are inserted in the second mounting space to allow for shorter cable connections between the one or more servers and the one or more switches than if the one or more switches were inserted at a top of the first mounting space.

* * * * *